United States Patent [19]

Hara et al.

[11] Patent Number: 4,700,225
[45] Date of Patent: Oct. 13, 1987

[54] METHOD AND APPARATUS FOR TESTING PATTERN OF A PRINTED CIRCUIT BOARD

[75] Inventors: Yasuhiko Hara, Tokyo; Keiya Saito, Yokohama; Koichi Karasaki, Kanagawa; Akira Sase, Ibaragi, all of Japan

[73] Assignee: Hitachi, Ltd., Tokyo, Japan

[21] Appl. No.: 913,242

[22] Filed: Sep. 30, 1986

[30] Foreign Application Priority Data

Oct. 2, 1985 [JP] Japan .................................. 60-218112

[51] Int. Cl.$^4$ ............................................. H04N 7/18
[52] U.S. Cl. ......................................... 358/106; 382/8
[58] Field of Search ................. 358/106, 101, 107, 93, 358/225; 382/8

[56] References Cited

U.S. PATENT DOCUMENTS 4,148,065 4/1979 Nakagawa ........................... 358/101
4,152,723 5/1979 McMahon ........................... 358/106
4,556,903 12/1985 Blitchington ....................... 358/106

Primary Examiner—Howard W. Britton
Attorney, Agent, or Firm—Antonelli, Terry & Wands

[57] ABSTRACT

A method and an apparatus for testing the pattern of a printed circuit board, comprising a stroboscope for emitting intermittent light synchronously with the feed velocity of the printed circuit board; a condenser lens for gathering the intermittent light emitted from the stroboscope and irradiating the gathered light to the printed circuit board; a filter for converting the light of the stroboscope to exciting light; a half mirror for reflecting the exciting light gathered by the condenser lens and converted by the filter, then projecting the reflected light upon the printed circuit board perpendicularly thereto, and passing the excited fluorescent light from the substrate of the printed circuit board; an imaging lens for forming an image of the fluorescent light passed through the half mirror; another filter for eliminating any other light than the fluorescent light out of the entire light passed through the half mirror; a TV camera for picking up the fluorescent image formed by the imaging lens; a memory for storing the preceding-frame pattern video signal obtained from the TV camera with the stroboscope turned on and attenuated by an amount corresponding to the afterimage component; a circuit for subtracting the attenuated stored pattern video signal from the present-frame pattern video signal obtained from the TV camera with the stroboscope turned on; a circuit for generating a reference pattern; and a circuit for producing a negative pattern of the wiring pattern from the output signal of the subtracting circuit and comparing the negative pattern with the reference pattern. In this invention, the image of the printed circuit board set on the table in continuous motion is picked up by the TV camera without any harmful influence of the afterimage so that the printed circuit board can be properly checked to ascertain whether the wiring pattern thereof is normal or not.

5 Claims, 5 Drawing Figures

4,700,225

METHOD AND APPARATUS FOR TESTING PATTERN OF A PRINTED CIRCUIT BOARD

BACKGROUND OF THE INVENTION

The present invention relates to a method and an apparatus for rapidly testing the wiring pattern of a printed circuit board on the basis of a negative pattern thereof obtained through a TV camera by detecting and picking up the image of a feeble fluorescent light emitted from a substrate (of glass epoxy, glass polyimide, etc.) of the printed circuit board.

There have been known heretofore apparatus developed for inspection of any defect in the pattern of a printed circuit board by the use of a TV camera as a pattern detector which detects a fluorescent light emitted from a substrate of the printed circuit board and picks up a negative pattern of the wiring pattern. Some of such prior apparatus are disclosed in, for example, U.S. patent application Ser. No. 619,918, abandoned, German patent application No. P3422395.9, and Papers Nos. 1682 and 1683 delivered in General Meeting of Electronic Communication Society, 1985. However, according to the above prior art in which two-dimensional image pickup by a TV camera is effected, it is impossible to achieve the pickup operation while keeping the printed circuit board in motion under continuous illumination. Therefore, in a state where an X-Y stage holding the printed circuit board thereon is repeatedly displaced by a predetermined distance and is brought to halt in a step-and-repeat mode, a still image of the wiring pattern is picked up and detected by the TV camera with the X-Y stage retained at a standstill.

In such pattern detection, the X-Y stage need not be halted in the case of using stroboscopic illumination. However, since its illuminance is relatively low, a stroboscope is not applicable as an illumination source. With regard to a means for solving the above problem, a superhigh-sensitivity TV camera with a SIT (silicone intensifier target) image tube may be employed as a pattern detector. But there still exists difficulty in its use due to the considerable amount of afterimage of the SIT image tube (30% afterimage remaining in the next scanning).

SUMMARY OF THE INVENTION

It is an object of the present invention to provide a method and an apparatus capable of rapidly testing the wiring pattern of a printed circuit board under stroboscopic illumination without the necessity of halting an X-Y stage where the printed circuit board is held, by the use of a superhigh-sensitivity TV camera which picks up the image of a negative pattern of such wiring pattern through detection of a fluorescent light therefrom without any harmful influence of the afterimage.

The present invention comprises a stroboscope for emitting intermittent light therefrom synchronously with the feed velocity of a printed circuit board; a condenser lens for gathering the intermittent light emitted from the stroboscope and irradiating the light to the printed circuit board; a filter for converting the light of the stroboscope to exciting light; a half mirror for reflecting the exciting light converted by the filter posterior to the condenser lens, then projecting the exciting light upon the printed circuit board perpendicularly thereto, and passing the fluorescent light excited by the substrate of the printed board; an imaging lens for forming an image of the fluorescent light passed through the half mirror; a filter for eliminating any other light than the fluorescent light passed through the half mirror; a TV camera for picking up the image of the fluorescent light formed by the imaging lens; a memory means for storing the pattern video signal obtained in the preceding frame from the TV camera with turn-on of the stroboscope and attenuated by an amount corresponding to the afterimage; a means for subtracting the stored attenuated pattern video signal from the present-frame pattern video signal detected by the TV camera with turn-on of the stroboscope; and a means for comparing a negative pattern of the wiring pattern obtained from the output signal of the subtracting means with a reference pattern obtained from a reference pattern generating means: wherein the image of the printed circuit board held on the table is picked up by the TV camera with continuous displacement of the table, and the wiring pattern of the printed circuit board is tested to ascertain whether it is normal or not without being affected by the afterimage.

DETAILED DESCRIPTION OF THE PREFERRED EMBODIMENT

Figure 1:
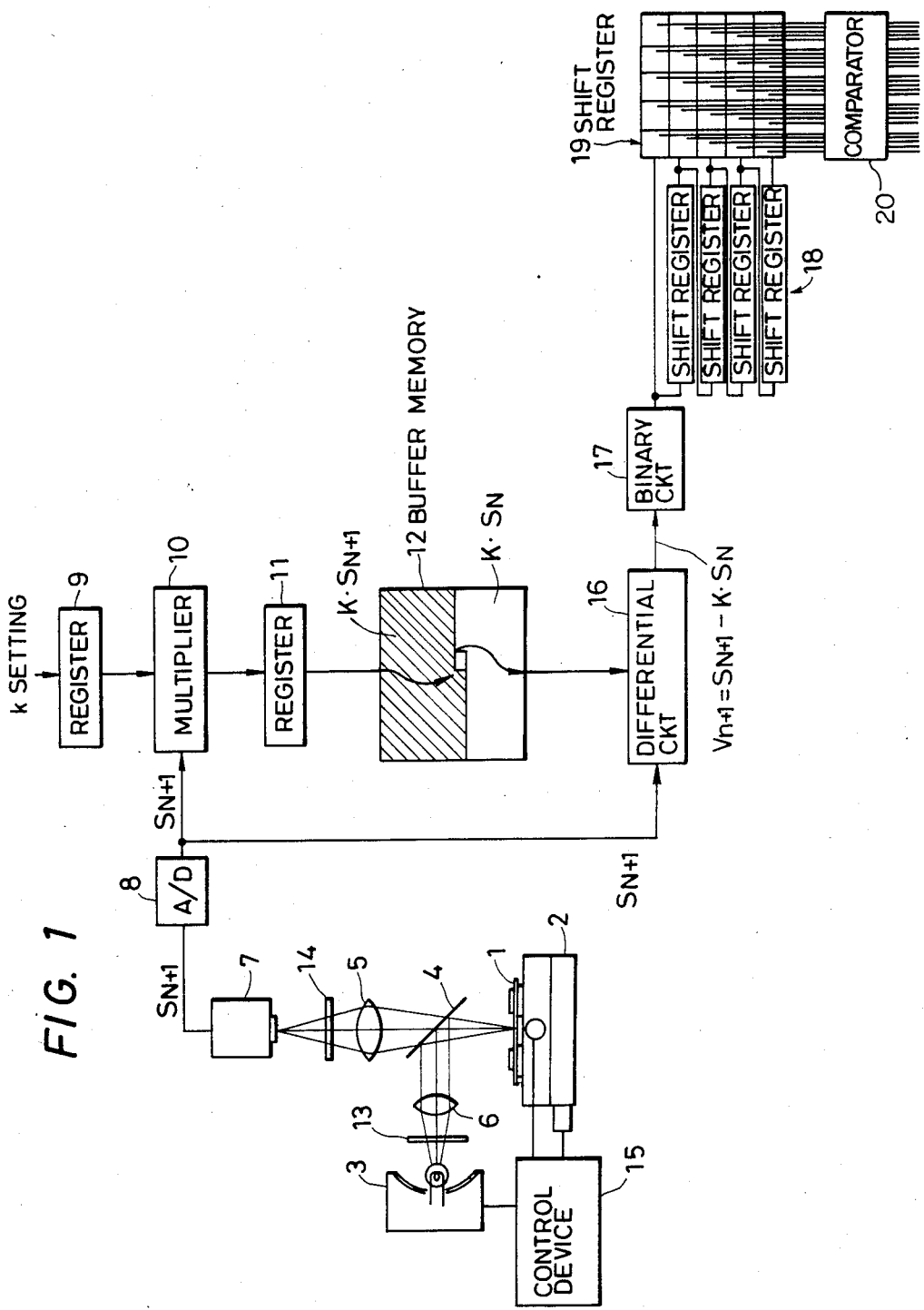
FIG. 1 is a schematic block diagram showing the constitution of an exemplary afterimage-erasing pattern detector according to the present invention.

Hereinafter the present invention will be described specifically with reference to an exemplary embodiment thereof shown in the accompanying drawings. Denoted by 1 is a printed circuit board consisting of a substrate 1a which is composed of glass epoxy, glass polyimide or similar material and emits fluorescent light, and a wiring pattern 1b. Also shown are an X-Y table 2 movable in X-Y directions with the printed circuit board 1 held thereon; a stroboscope 3 energized in response to a signal from a control device 15 for moving the X-Y table 2 and caused to flash synchronously with the motion of the X-Y table 2; and a half mirror 4 consisting preferably of a dichroic mirror which reflects the exciting light emitted from the stroboscope 3 and passes therethrough the excited fluorescent light from the substrate 1a of the printed circuit board 1. Generally the dichroic mirror 4 has such characteristics that, when light is incident thereon at an angle of 45°, the transmissivity is 0% at any wavelength below 460 nm to induce substantially total reflection or is higher than 90% at any wavelength above 510 nm to induce partial reflection. Thus, in comparison with the half mirror, the dichroic mirror is superior in both the reflectivity of exciting light and the transmissivity of fluorescent light. Further shown are a condenser lens 6 for gathering the light emitted from the stroboscope 3 and converting it to a parallel light flux; a blue filter 13 disposed between the stroboscope 3 and the dichroic mirror 4 to pass therethrough the light of wavelengths ranging from 300 to 460 nm; an imaging lens 5 for forming an image of the fluorescent light pattern excited by the substrate 1a of the printed circuit board 1 and passed through the dichroic mirror 4; a superhigh-sensitivity TV camera 7 with a SIT (silicone intensifier target) image tube for picking up the image of the fluorescent light pattern formed by the imaging lens 5; and a yellow filter 14 disposed between the TV camera 7 and the dichroic mirror 4 to pass therethrough the fluorescent light of wavelengths above 500 nm while reflecting any light of wavelengths below 500 nm.

Figure 3A:
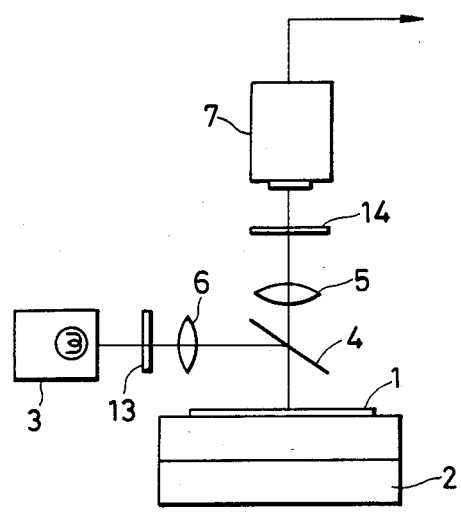
FIGS. 3 (a), 3(b) and FIG. 4 graphically illustrate the theoretical background of the invention.
Figure 3B:
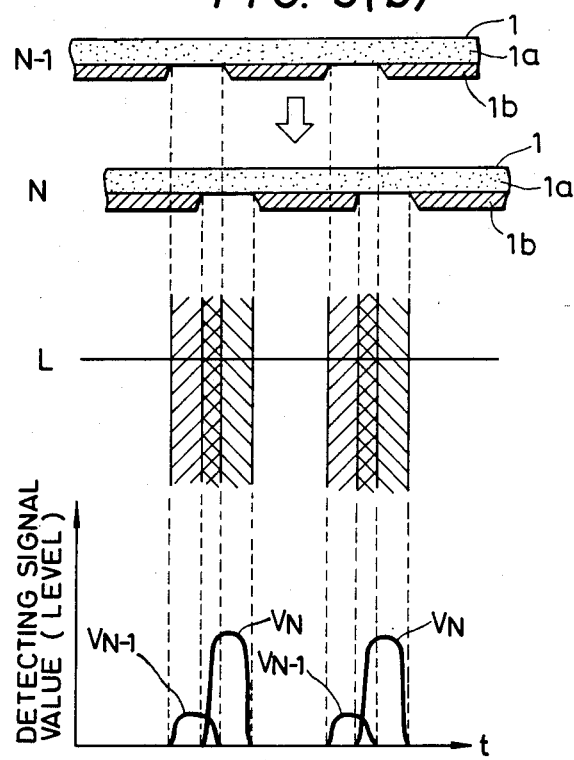

As shown in FIG. 3 (a), the printed circuit board 1 having a pattern is scanned by the X-Y stage 2, while the flash light from the stroboscope 3 is gathered by the condenser lens 6 and is converted to a parallel light flux, which is then passed through the blue filter 13 to become exciting light of a wavelength below 460 nm and is irradiated to the printed circuit board 1 through the dichroic mirror 4. The excited fluorescent light from the substrate 1a of the printed circuit board 1 is passed through the dichroic mirror 4 and the yellow filter 14, while the reflected light from the wiring pattern 1b is intercepted and is detected by the TV camera 7 through the imaging lens 5. The pattern detection signal $S_N$ obtained in scanning one frame is such as shown in FIG. 3 (b), where the pattern positional state (represented by ▨) in the preceding-frame scanning is changed to the patern positional state (represented by ▧) in the present-frame scanning with displacement of the printed circuit board 1 to produce the signal on the main scanning line L in the present-frame scanning, i.e. the pattern detection signal. In FIG. 3 (b), $V_N$ denotes a detection signal to be detected essentially in the present-frame scanning, and $V_{N-1}$ denotes a signal detected in the preceding-frame scanning and included as an afterimage component in the pattern detection signal $S_N$ obtained in the present-frame scanning.

Figure 4:
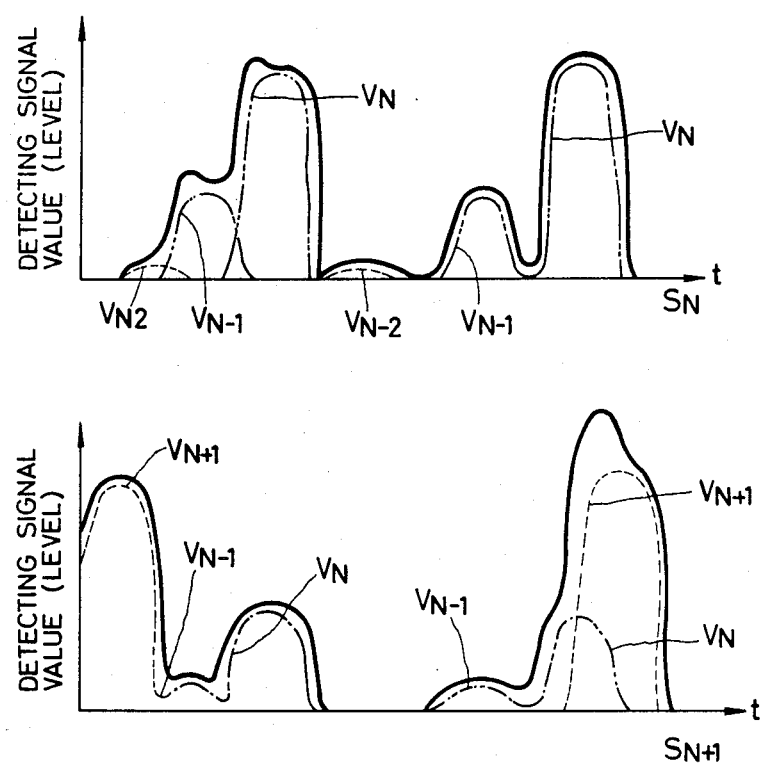

Thus the pattern detection signal includes the afterimage component in the preceding-frame scanning, as graphically plotted in FIG. 4 for general explanation. In the pattern detection signal $S_N$ detected on a particular scanning line at the time of scanning a certain frame, as shown in FIG. 4, there are included pattern detection signals $S_{N-1}$, $S_{N-2}$ which correspond to the afterimage components derived from the main scanning anterior to the preceding frame. Also the pattern detection signal $S_{N+1}$ obtained in the next-frame scanning includes the pattern detection signal $S_N$ corresponding to the afterimage component derived from the preceding-frame scanning.

Accordingly, with the afterimage attenuation factor k $(0 < k < 1)$, the pattern detection signals $S_N$ and $S_{N+1}$ are expressed as $$S_N = V_N + KV_{N-1} + k^2V_{N-2} + \ldots \quad (1)$$

$$S_{N+1} = V_{N+1} + kV_N + k^2V_{N-1} + \ldots \quad (2)$$

Eq. (2) may be modified as $$S_{N+1} = V_{N+1} + k(V_N + KV_{N-1} + \ldots) \quad (3)$$

$$= V_{N+1} + kS_N$$

It is therefore obvious that the signal $V_{N+1}$ can be calculated from Eq. (4) as follows.

$$V_{N+1} = S_{N+1} - kS_N \quad (4)$$

Thus, the true pattern detection signal in scanning a certain frame is calculated through subtraction of a signal level, which is obtained by multiplying the pattern detection signal in the preceding-frame scanning by the attenuation factor k, from the signal detected actually in the certain-frame scanning.

Describing the present invention more specifically, FIG. 1 is a schematic block diagram showing the constitution of an exemplary afterimage-erasing pattern detector according to the present invention.

In this embodiment, the operation performed until obtaining a pattern detection signal from the TV camera 7 is the same as in the foregoing example of FIG. 3 (a), and thereafter the pattern detection signal is processed in the following manner.

The pattern detection signal $S_{N+1}$ obtained in the $(N+1)$st scanning by the TV camera 7 is converted to a multiple-valued digital signal by an A/D converter 8 and then is multiplied by the afterimage attenuation factor k (preset in a register 9) by means of a multiplier 10. Subsequently the digital signal is stored via a register 11 sequentially in the predetermined order of addresses in a multi-stage video buffer memory 12. Meanwhile a value $kS_N$, which is a result of multiplying by the attenuation factor k the pattern detection signal $S_N$ obtained in the Nth scanning by the TV camera 7, has already been stored in the buffer memory 12. Therefore, the true pattern detection signal $V_{N+1}$ $(=S_{N+1}-kS_N)$ in the $(N+1)$st scanning without any harmful influence of the afterimage can be obtained by first reading out the value $kS_N$ from the buffer memory 12 synchronously with the pattern detection signal $S_{N+1}$ prior to storage thereof and then calculating the difference in a difference circuit 16.

Figure 2:
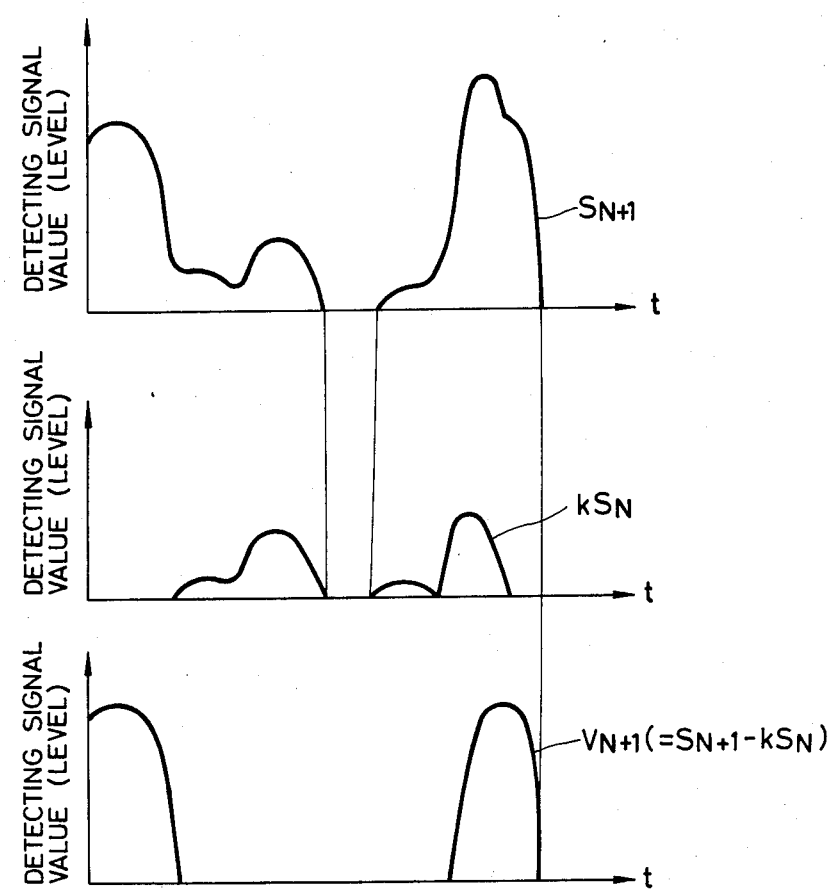
FIG. 2 graphically illustrates how a pattern detection signal is processed in the present invention.

FIG. 2 graphically shows the processing steps mentioned hereinabove, about which no particular explanation may be needed.

The true pattern detection signal $V_{N+1}$ is further converted to a binary signal by a binary circuit 17 and then is inputted sequentially to a group of shift registers 18 which store the signal of one scanning line therein. The outputs of such registers are arrayed in the form of, for example, 5×5 pixels and stored in an array circuit 19 composed of shift registers.

Meanwhile, another similar combination of the component devices 1 through 19 are provided separately to constitute a reference pattern generating means and, with a reference printed circuit board set on the X-Y table in this combination, a reference pattern can be generated from the array circuit in such separate combination. Then the pattern of the printed circuit board to be tested is arrayed by the circuit 19 into discrete pixels, which are compared by the comparator 20 with the pixels of the reference pattern obtained from another array circuit, whereby a desired test is conducted to detect the existence of any noncoincident portion with the positional deviation taken into consideration.

If the printed circuit board to be tested and the reference one are set together on the same X-Y table 2 with exact initial positioning, then the images of the mutually corresponding regions can be picked up by the individual TV cameras so that the comparator 20 can compare the mutually corresponding pixels (within the range of allowable positional deviations). A description on such comparison is omitted here since it is specifically disclosed in U.S. Pat. No. 4,148,065.

Thus, in using a TV camera or the like as a pattern detector which is generally affected by the afterimage, the present invention is employable for the purpose of eliminating such harmful influence of the afterimage. And it is suited particularly for achieving fast detection of a wiring pattern. Since the afterimage influence can be averted by image pickup and detection of the wiring pattern with flashes of a stroboscopic illumination, the TV scanning detection signal at each time can be utilized for detection of the pattern. When using fluorescent light or stroboscopic illumination for pattern detection as mentioned above, it is inevitable to employ a superhigh-sensitivity TV camera in case the fluorescent light to be detected is feeble, but the use of such camera has generally been difficult heretofore due to the considerable amount of afterimage. However, according to the present invention, the TV scanning signal at each time is rendered applicable by a combination of a superhigh-sensitivity TV camera and a stroboscope, thereby attaining fast pattern detection to eventually ensure a quick test of the pattern.

In the present invention, as mentioned hereinabove, the operation of any pattern detector prone to be affected greatly by the afterimage can be performed without such harmful influence of the afterimage to consequently achieve proper detection of the pattern.

We claim:

1. A method of testing the pattern of a printed circuit board, comprising the steps of: emitting intermittent light from a stroboscope synchronously with a feed velocity of said printed circuit board; gathering said intermittent light by a condenser lens; converting said light to exciting light through a filter; reflecting said exciting light by a half mirror to project the same upon said printed circuit board perpendicularly thereto and passing through said half mirror the fluorescent light emitted from the substrate of said printed circuit board; forming an image of the fluorescent light passed through said half mirror by means of an imaging lens while eliminating any other light than the fluorescent light through another filter, thereby passing therethrough the fluorescent image; picking up the fluorescent image by a TV camera; attenuating, by an amount corresponding to the afterimage component, the preceding-frame pattern video signal obtained from said TV camera with said stroboscope turned on, and storing the attenuated pattern video signal in a memory means; subtracting the stored attenuated pattern video signal from the present-frame pattern video signal obtained from said TV camera with said stroboscope turned on, thereby producing a negative pattern of the wiring pattern; and comparing said negative pattern with a reference pattern to check whether the wiring pattern of said printed circuit board is normal or not.

2. An apparatus for testing the pattern of a printed circuit board, comprising: a stroboscope for emitting intermittent light synchronously with a feed velocity of said printed circuit board; a condenser lens for gathering the intermittent light emitted from said stroboscope and irradiating the gathered light to said printed circuit board; a filter for converting the light of said stroboscope to exciting light; a half mirror for reflecting the exciting light gathered by said condenser lens and converted by said filter, then projecting the reflected light upon said printed circuit board perpendicularly thereto, and passing the excited fluorescent light from the substrate of said printed circuit board; an imaging lens for forming an image of the fluorescent light passed through said half mirror; a filter for eliminating any other light than the fluorescent light out of the entire light passed through said half mirror; a TV camera for picking up the fluorescent image formed by said imaging lens; a memory means for storing the preceding-frame pattern video signal obtained from said TV camera with said stroboscope turned on and attenuated by an amount corresponding to the afterimage component; a means for subtracting said attenuated stored pattern video signal from the present-frame pattern video signal obtained from said TV camera with said stroboscope turned on; a means for generating a reference pattern; and a means for producing a negative pattern of the wiring pattern from the output signal of said subtracting means and comparing said negative pattern with said reference pattern.

3. The apparatus as defined in claim 2, wherein said half mirror consists of a dichroic mirror.

4. The apparatus as defined in claim 2, further comprising an A/D converter for converting the output video signal of said TV camera to a digital video signal.

5. The apparatus as defined in claim 4, further comprising a multiplier for multiplying the digital video signal of said A/D converter by an attenuation factor, wherein the output of said multiplier is stored in said memory means.

* * * * *